(12) United States Patent
Bookbinder (10) Patent No.: US 6,220,767 B1
(45) Date of Patent: Apr. 24, 2001

(54) SEMICONDUCTOR LASER OPTICAL WAVEGUIDE TELECOMMUNICATIONS MODULE AND METHOD OF MAKING

(75) Inventor: Dana C. Bookbinder, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/312,726

(22) Filed: May 14, 1999

(51) Int. Cl.[7] .................................................. G02B 6/36
(52) U.S. Cl. .................................................. 385/94; 385/88
(58) Field of Search .................................. 385/88, 89, 92, 385/93, 94

(56) References Cited

U.S. PATENT DOCUMENTS

| | | |
|---|---|---|
| 5,392,305 | 2/1995 | Jakobson . |
| 5,513,198 | 4/1996 | Jakobson . |
| 5,613,031 * | 3/1997 | Tanabe et al. .................... 385/138 |
| 5,629,952 | 5/1997 | Bartholomew et al. . |
| 5,696,785 | 12/1997 | Bartholomew et al. . |
| 6,123,464 * | 9/2000 | Murata et al. ..................... 385/92 |

FOREIGN PATENT DOCUMENTS

0720260A1    6/1995   (EP) .

OTHER PUBLICATIONS

Corning® LaserLife™ Getter Assemblies, product brochure, Corning Incorporated, 7/98.

* cited by examiner

Primary Examiner—Hung N. Ngo
(74) Attorney, Agent, or Firm—Juliana Agon; Edward F. Murphy

(57) ABSTRACT

One aspect of the present invention is a method of making a semiconductor laser optical waveguide telecommunications module which includes providing a semiconductor laser, a housing, and an oxidizing atmosphere, such that the oxidizing atmosphere is in contact with the semiconductor laser and contained by the housing. In another aspect, the invention includes a semiconductor laser optical waveguide telecommunications module that includes a semiconductor laser, a housing for enclosing the semiconductor laser and an $O_2$-free oxidizing atmosphere in contact with the semiconductor laser and contained by the housing.

87 Claims, 5 Drawing Sheets

SEMICONDUCTOR LASER OPTICAL WAVEGUIDE TELECOMMUNICATIONS MODULE AND METHOD OF MAKING

BACKGROUND OF THE INVENTION

1. Field of the Invention

The present invention relates generally to optical waveguide telecommunications devices utilized in optical telecommunications systems, and particularly to semiconductor laser optical waveguide devices and methods for making such devices.

2. Technical Background

The present invention relates generally to optical waveguide telecommunications devices, semiconductor lasers, and particularly to semiconductor laser optical waveguide telecommunications modules utilized in optical waveguide telecommunications systems and methods of making such semiconductor laser optical waveguide telecommunications modules. Semiconductor lasers are utilized in optical waveguide telecommunications systems to produce photons. Semiconductor laser optical waveguide telecommunications modules can include pump lasers that pump optical waveguide amplifiers and transmitter lasers that transmit modulated optical signals.

Optical signals generated by transmitter lasers are normally transmitted through optical fibers and the optical signals tend to weaken as they travel along the optical fibers. Optical amplifiers which utilize semiconductor lasers provide an economic means of amplifying such weakened optical signals while maintaining the optical nature of the signal. Erbium doped optical fiber amplifiers have become the dominant means of amplifying optical signals in the 1550 nm optical telecommunications window. Such erbium doped optical fiber amplifiers are normally pumped with 980 nm and/or 1480 nm semiconductor pump lasers. With such an amplifier-pump system, electrical energy applied to the 980 nm (1480 nm) semiconductor pump laser produces 980 nm (1480 nm) photons which are coupled through an optical fiber pigtail into the erbium doped optical fiber. The 980 nm and/or 1480 nm pump light excites/energizes the erbium ions in the erbium doped optical fiber so that optical telecommunications signals such as wavelengths centered about 1550 nm are amplified by the excited/energized erbium ions. The optical pumping of optical amplifiers with semiconductor produced photons has become the standard in the optical telecommunications industry, but the ever growing high output requirements of semiconductor pump lasers poses problems for the making of reliable semiconductor lasers modules. It appears that the commercially available maximum reliable output power of 980 nm semiconductor laser pumps may plateau in the 300 mW output power range while the input pump power requirements of optical amplifiers will continue to climb.

Semiconductor lasers have faced reliability problems with the most prevalent being catastrophic optical facet damage of the semiconductor laser. Total failure of semiconductor lasers have been found when the catastrophic optical facet damage level of laser falls below the operating power output of the laser. Additionally in the past it has been found that dark-line defects and facet corrosion have limited the useful life of semiconductor lasers. Many narrow strip emitter lasers failed before 5,000 hours of operation when operated above a high output power of 100 mW. Special attention to the semiconductor laser itself and protective coatings on the semiconductor laser facets (passivation layers) have resulted in some improvement in the reliability of semiconductor lasers. The making of highly reliable high output semiconductor lasers optical waveguide telecommunications modules requires such special attention not only to the semiconductor laser itself but also the other components of the module and how they interact before and during operation of the laser. Such special attention should include the gas, if any, that is incorporated inside the module.

SUMMARY OF THE INVENTION

One aspect of the present invention is a method of making a semiconductor laser optical waveguide telecommunications module which includes providing a semiconductor laser, a housing, and an $O_2$-free oxidizing atmosphere, such that the oxidizing atmosphere is in contact with the semiconductor laser and contained by the housing.

In another aspect, the invention includes a semiconductor laser optical waveguide telecommunications module that includes a semiconductor laser, housing enclosing the semiconductor laser and an $O_2$-free oxidizing atmosphere in contact with the semiconductor laser and contained by the housing.

In another aspect, the invention includes a method of making a semiconductor laser optical waveguide telecommunications module that includes providing a semiconductor laser, a housing, a sealing atmosphere, and a solid oxidant, and sealing the semiconductor laser, the sealing atmosphere, and the solid oxidant within the housing.

In another aspect, the invention includes a semiconductor laser optical waveguide telecommunications module that includes a semiconductor laser, a solid oxidant, a sealing atmosphere in contact with the semiconductor laser and the solid oxidant, and a housing containing the sealing atmosphere, the semiconductor laser, and the solid oxidant.

In preferred embodiments the inventive module is an optical waveguide telecommunications module that includes an optical waveguide fiber within the housing.

The present invention results in a number of advantages compared to prior art methods and devices. The present invention provides economic and convenient methods of making semiconductor laser optical waveguide telecommunications modules while avoiding complications and problems faced with other methods of making semiconductor laser optical waveguide telecommunications devises. For example the present invention allows for a high power pump laser that does not require the inclusion of $O_2$ gas in the packaging of the pump laser. The invention includes a semiconductor laser optical waveguide telecommunications module which has a semiconductor laser enclosed in a housing with an $O_2$-free oxidizing atmosphere, such that the oxidizing atmosphere is in contact with the laser and contained by the housing; and the method of making such.

The invention includes a method of making telecommunications module by providing a housing, providing an oxidizing atmosphere which includes a nitrogen oxide and enclosing the laser and the atmosphere within the housing.

The invention includes such a telecommunications module with a semiconductor laser, a housing which encloses the laser, and an oxidizing atmosphere which includes nitrogen oxide and is in contact with the laser and contained in the housing.

The invention includes a method of making telecommunications module by providing a housing, providing an oxidizing atmosphere which includes ozone and enclosing the laser and the atmosphere in the housing.

The invention includes such a telecommunications module with a semiconductor laser, a housing, and an oxidizing atmosphere which includes ozone and is in contact with the laser and contained by the housing.

The invention includes a method of making telecommunications module by providing an oxidizing atmosphere which includes hydrogen peroxide and enclosing the laser and the atmosphere within the housing.

The invention includes such a telecommunications module with a semiconductor laser, a housing, and an oxidizing atmosphere which includes hydrogen peroxide and is in contact with the laser and contained by the housing.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE PREFERRED EMBODIMENTS

In accordance with the invention, the present invention of making a semiconductor laser optical telecommunications module method includes a providing a semiconductor laser and a housing.

Figure 1:
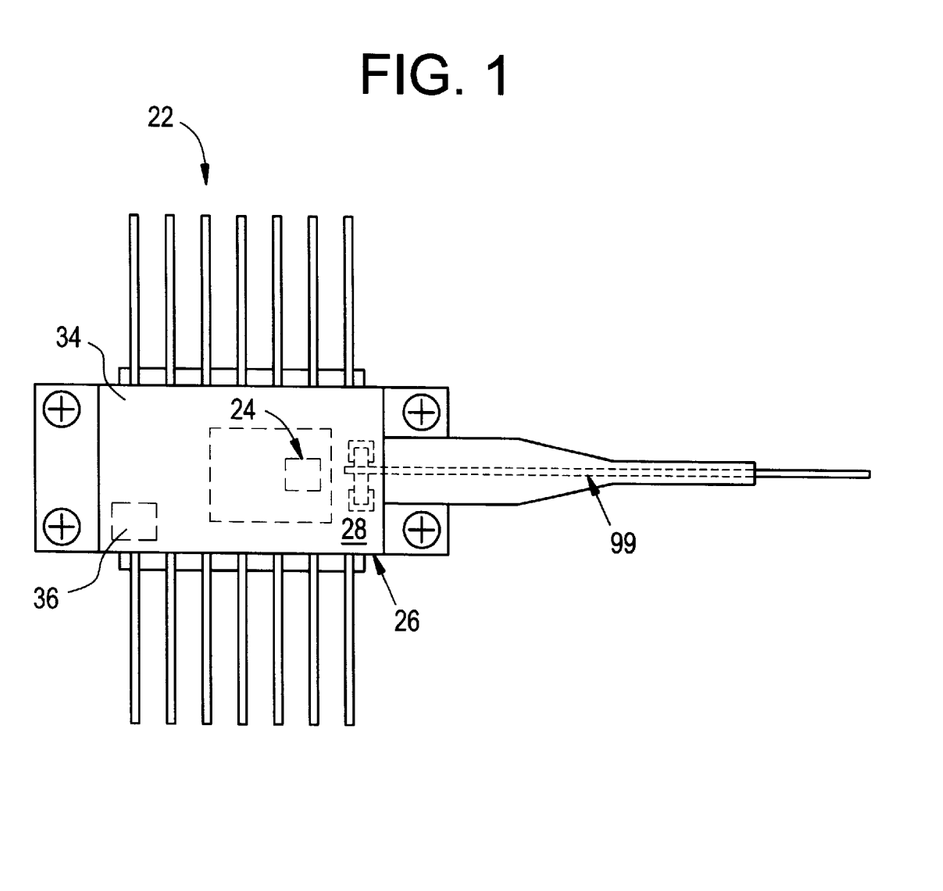
FIG. 1 is a top view of a device embodying the invention.

FIG. 1 shows a semiconductor laser optical telecommunications module 22 made in accordance with the present invention. Semiconductor laser optical telecommunications module 22 includes a semiconductor laser 24. Semiconductor laser 24 emits light centered about a wavelength utilized in an optical telecommunications system, such as an optical transmission signal or pump light used to excite an optically excitable medium. Preferably semiconductor laser 24 is a high power pump laser which has a high power output suitable for pumping optical amplifiers used in optical telecommunications systems, including WDM systems.

Semiconductor laser optical telecommunications module 22 further includes a housing 26 that encloses and contains semiconductor laser 24. Housing 26 not only encloses and contains semiconductor laser 24 and the other components internal to semiconductor laser module 22, but also encloses and contains sealing atmosphere 28. Housing 26 inhibits atmosphere 28 from escaping into the surrounding outside environment and prevents the invasion of contaminants from the outside environment.

The method of making semiconductor laser module 22 includes the steps of providing semiconductor laser 24, providing housing 26, providing an $O_2$-free oxidizing atmosphere 28 and enclosing semiconductor laser 26 and $O_2$-free oxidizing atmosphere 28 within housing 26. Providing $O_2$-free oxidizing atmosphere 28 and enclosing such with semiconductor laser 24 improves the reliability and useful life of semiconductor laser 24 when used in optical telecommunications systems, and inhibits the catastrophic optical facet damage level of laser 24 from going below the operating power output level required by the optical telecommunications system. In that $O_2$-free oxidizing atmosphere 28 is free of the $O_2$ oxygen molecule, $O_2$ and its detrimental side effects are excluded from the interior of module 22. $O_2$-free oxidizing atmosphere 28 is substantially void of $O_2$ molecules and has a trace containment O2 molecule level less than 100 ppm by weight. Such an $O_2$-free oxidizing atmosphere provides for the oxidative removal of deliterions contaminants on the light emitting surface of semiconductor laser 24. It is believed that organic contaminants that may be inadvertently contained within a semiconductor laser housing during packaging procedures can be carbonized on the light emitting surfaces of the semiconductor laser and then detrimentally effect the performance of the laser by changing the reflectivity of the light emitting surface. The $O_2$-free oxidizing atmosphere utilized in the invention can remove and inhibit such contaminants through oxidation.

The $O_2$-free oxidizing atmosphere utilized in the invention includes an oxidant gas. The oxidant gas provides for the beneficial oxidizing characteristics of oxidizing atmosphere 28. The oxidizing atmosphere preferably includes an inert gas, and may be comprised of a plurality of inert gasses. An inert gas is one that does not chemically react under normal operating conditions with the elements of module 22 that are contained within housing 26. Examples of such inert gasses are gas molecules of argon, helium, and nitrogen. It is preferred that the oxidant gas is a minority gas member of oxidizing atmosphere 28, and that the inert gas makes up the majority of oxidizing atmosphere 28. Preferably the oxidant gas is less than 10% by volume of the oxidizing atmosphere 28.

In an embodiment of the invention, $O_2$-free oxidizing atmosphere 28 includes a nitrogen oxide as the oxidant gas. A preferred and economic nitrogen oxide utilized in the invention is nitrous oxide (dinitrogen monoxide). Additional nitrogen oxide oxidant gasses are nitric oxide (nitrogen monoxide), nitrogen dioxide, and dinitrogen tetroxide. Nitrogen oxides are preferably utilized in the invention as the oxidant gas of oxidizing atmosphere 28. Preferred inert gases are the noble gases. In a further embodiment, ozone can be utilized as the oxidant gas of oxidizing atmosphere 29. Additionally, hydrogen peroxide may be used as the oxidant gas.

Figure 2:
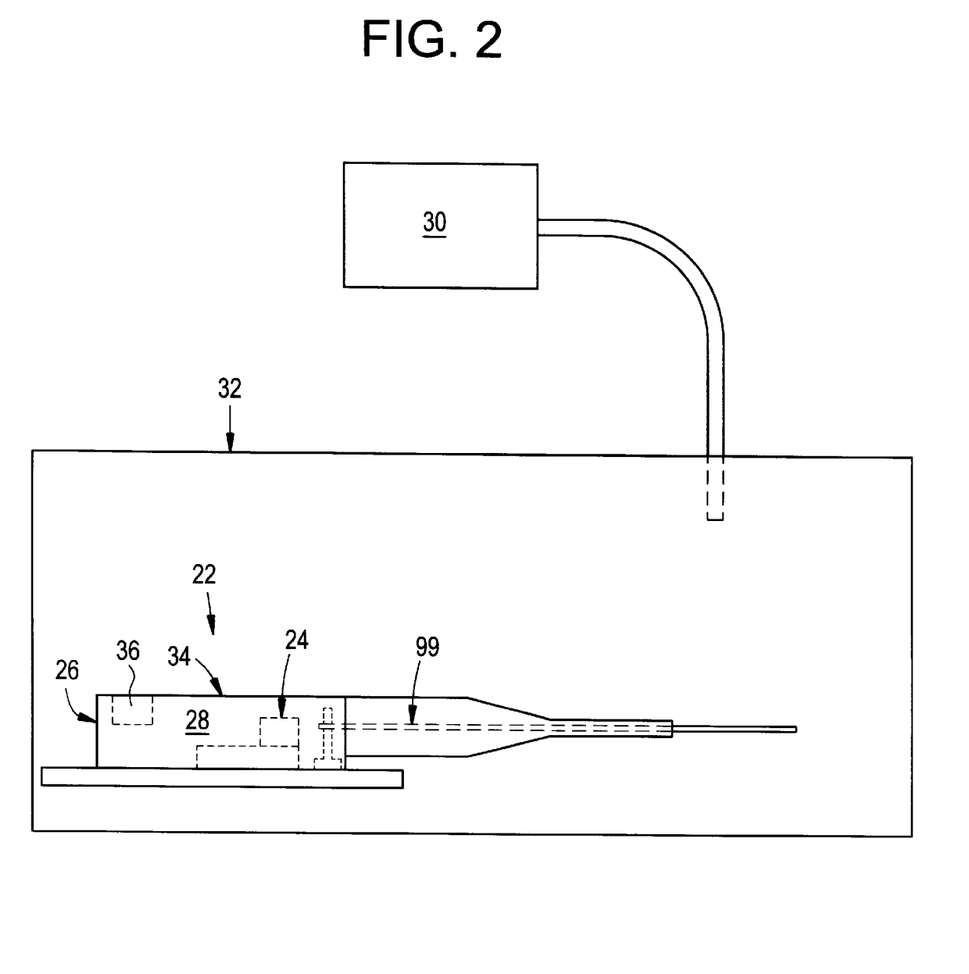
FIG. 2 is a side view of a device and method embodying the invention.

FIG. 2 shows a side view of semiconductor laser module 22 and additionally illustrates a way to practice the inventive method of making a semiconductor laser optical waveguide telecommunications module 22. Oxidizing atmosphere supply 30 and atmosphere containment assembly packaging vessel 32 can be used to provide $O_2$-free oxidizing atmosphere 28 and enclosing semiconductor laser 24 and oxidizing atmosphere 28 within housing 26. The inventive method can be practiced by providing semiconductor laser 24 and housing 26 within atmosphere containment vessel 32 such that oxidizing atmosphere supply 30 can be used to provide oxidizing atmosphere 28 within housing 26, and such oxidizing atmosphere maintained while semiconductor laser 24 and oxidizing atmosphere 28 is being enclosed within housing 26. Such enclosing and sealing of the contents within housing 26 can be achieved by securing housing lid 34 in place such as by welding, adhering, soldering, seam sealing, or other securing steps.

In a preferred method of the invention, housing 26 is cleaned prior to enclosing semiconductor laser 24, oxidizing atmosphere 28, and other elements of module 22 within housing 26. The additional method step of cleaning housing 26 is exercised to ensure that contaminants such as organic molecules, water, and hydrogen are not inadvertently enclosed within housing 26. Such cleaning of housing 26 may include cleaning with a plasma exposure or an exposure of ozone and UV radiation. Additionally, a corona process can be used for such cleaning of housing 26.

In addition to such cleaning processes, it is preferred that a cleaning solvent is used to clean housing 26 and the other elements of module 22 enclosed therein. With such a solvent cleaning method, semiconductor laser 24 emits a wavelength emission $\lambda_s$ and a cleaning solvent having third or fourth overtones at wavelength $\lambda_s$ is utilized. With such a cleaning solvent, it is assured that the solvent has no less than a third overtone at $\lambda_s$ so that any trace solvent molecules remaining after such cleaning do not interact and absorb the $\lambda_s$ photons emitted from semiconductor laser 24. Preferred solvents for use in this method are perhalogenated solvents such as carbon tetrachloride, $CF_3CCl_3$, or solvents that have halide-carbon bonds and are preferably free of C—H and O—H bonds.

In addition to enclosing semiconductor laser 24 and $O_2$-free oxidizing atmosphere 28 within housing 26, a preferred method of the invention includes providing a getter 36 and enclosing getter 36 within housing 26 along with semiconductor laser 24 and oxidizing atmosphere 28. The preferred getter 36 of the invention is able to absorb/adsorb contaminants present inside of housing 26 and detrimental products produced by reactions with the oxidant gas of oxidizing atmosphere 28. The preferred getter 36 of the invention is able to absorb/adsorb contaminants such as water molecules, organic molecules, and hydrocarbon molecules. Such getter materials and getter material containers are disclosed in U.S. Pat. No. 5,696,785 by Bartholomew et al. and European Patent Number EP0720260 by DeMeritt et al. and are commercially available from Corning Incorporated, Corning, New York as Corning® LaserLife™ brand getter assemblies The invention not only includes a method of making, but also includes the semiconductor laser optical waveguide telecommunications module made by the method. The invention includes a semiconductor laser optical waveguide telecommunications module 22 made up of a semiconductor laser 24, a housing 26 which encloses semiconductor laser 24, and an $O_2$-free oxidizing atmosphere 28 which is in contact with semiconductor laser 24 and is contained by housing 26. The $O_2$-free oxidizing atmosphere 28 is void of $O_2$ molecules and has an $O_2$ molecule content less than 100 ppm by weight. $O_2$-free oxidizing atmosphere 28 includes an oxidant gas, and preferably also an inert gas. Most preferably the oxidant gas is a minority constituent of atmosphere 28 and the inert gas or gasses are the majority constituents of atmosphere 28. Atmosphere 28 of module 22 may contain nitrogen oxides, for example nitric oxide, nitrogen dioxide, dinitrogen tetroxide, and nitrous oxide, as the oxidant gas. Additionally, the oxidant gas of atmosphere 28 can be ozone or hydrogen peroxide.

As shown in FIG. 1–2, in a preferred embodiment, module 22 includes a getter 36 that is in contact with atmosphere 28 and contained by housing 26. Getter 36 may be a getter material in a getter material container as previously disclosed and commercially available from Corning Incorporated, Corning, New York as Corning® LaserLife™ brand getter assemblies. Such a getter is convenient in that it is easily placed and secured within module 22, for example by attachment to housing lid 34 of housing 26.

Figure 3:
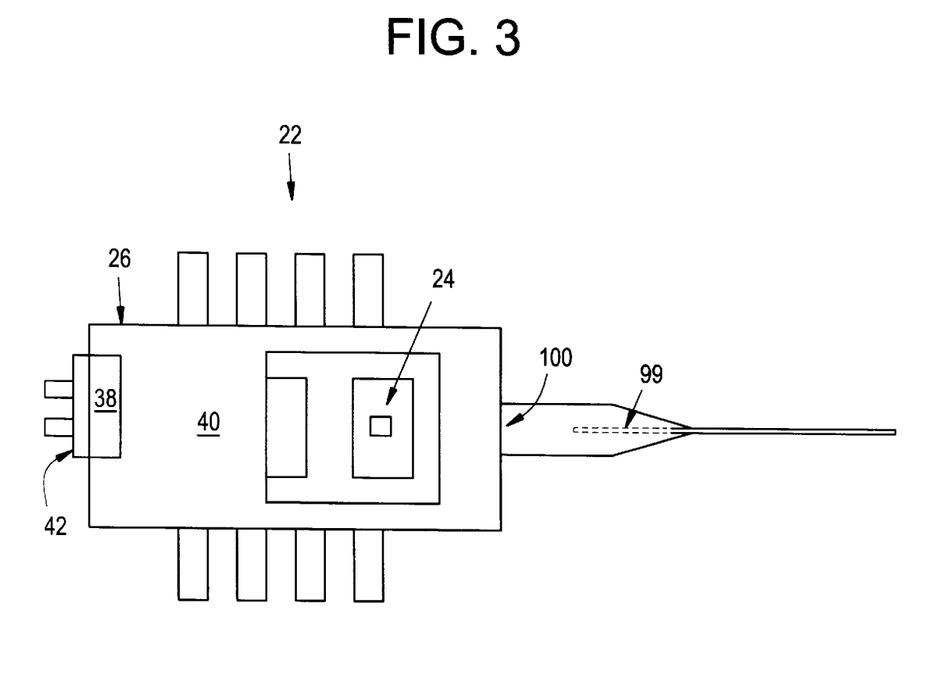
FIG. 3 is a top view of a device embodying the invention.
Figure 4:
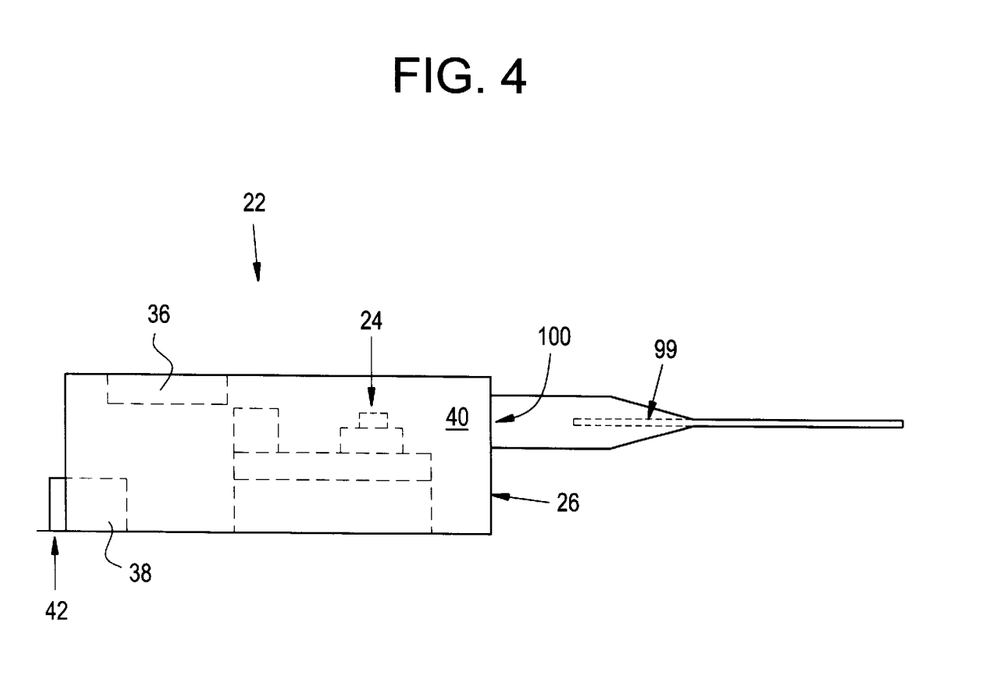
FIG. 4 is a side view of a device embodying the invention.

The invention further includes a method of making a semiconductor laser optical waveguide telecommunications module 22 which includes the steps of providing a semiconductor 24, providing a housing 26, providing a sealing atmosphere 40, providing a solid oxidant 38, and sealing semiconductor laser 24, sealing atmosphere 40, and solid oxidant 38 within housing 26. Solid oxidant 38 is a solid material that can be secured within housing 26, sealed therein, and then later activated so that it releases an oxidant gas into sealing atmosphere 40. Preferably solid oxidant 38 is a latent gaseous oxidant, for example $KMnO_4$ or $Na_2O_2$, $K_2S_2O_8$ (potassium persulfate), $KO_2$ (potassium superoxide), $NaBO_3$ (sodium perborate) or appropriate stable mixtures thereof. Preferably the latent gaseous oxidant is activated by heat. With solid oxidant 38 being a latent gaseous oxidant, the method preferably includes heating the latent gaseous solid oxidant after sealing semiconductor laser 24, sealing atmosphere 40, and solid oxidant 38 within housing 26. Such heating and release of an oxidant gas can be achieved by providing a solid oxidant heater 42 in thermal contact with solid oxidant 38, with heater 42 being inside or outside of housing 26. Additionally, such heating and release of an oxidant gas may be achieved by relying on the heat generated during the operation of module 22 (such as by thermoelectric heater/coolers, laser 24, and related electronic components, laser radiation emission) and/or by assembling and sealing module 22 at a temperature less than a post sealing temperature, such as the normal operating temperature.

Providing sealing atmosphere 40 preferably includes providing an inert sealing atmosphere in that the later activation of solid oxidant 38 releases oxidant gas into the sealing atmosphere, and most preferably the inert sealing atmosphere is free of $O_2$. Sealing atmosphere may be an $O_2$-free oxidizing atmosphere or other packaging atmosphere.

Additionally, the method can include the steps of providing getter 36 and enclosing getter 36, semiconductor laser 24, atmosphere 40, and solid oxidant 38 within housing 26. Solid oxidant 38 may be subcontained in a gas permeable container such as utilized with getter 36.

As described in the previous cleaning steps, it is preferred that housing 26 and other elements within module 22 are cleaned prior to sealing semiconductor laser 24, sealing atmosphere 40, and solid oxidant 38 within housing 26. Housing 26 may be cleaned using a plasma exposure, an exposure of ozone and UV radiation, or a corona cleaning process. As previously described, it is preferred to clean module 22 and its elements with a solvent that has relatively high order molecular bond overtones relative to the wavelength $\lambda_s$ emitted by laser 24. Provided that semiconductor laser 24 has a wavelength emission $\lambda_s$ the method preferably includes cleaning with a solvent having no less (lower) than a third overtone at the wavelength $\lambda_s$ (the solvent overtones at $\lambda_s$ are at least one of the third of fourth order). The solvent does not have first or second overtones at $\lambda_s$. Preferred solvents used are perhalogenated solvents (for example carbon tetrachloride, $CF_3CCl_3$) or solvents that have halide bonds and are free of C—H and O—H bonds.

The invention further includes a semiconductor laser optical waveguide telecommunications module made up of a semiconductor laser 24, a solid oxidant 38, and a sealing atmosphere 40 in contact with semiconductor laser 24 and solid oxidant 38, and a housing 26 containing sealing atmosphere 40, semiconductor laser 24, and solid oxidant 38. In a preferred embodiment solid oxidant 38 includes $KMnO_4$. In another preferred embodiment, solid oxidant 38 includes $Na_2O_2$. In another preferred embodiment, solid oxidant 38 includes $K_2S_2O_8$. In another preferred embodiment, solid oxidant 38 includes $KO_2$. In another preferred embodiment, solid oxidant 38 includes $NaBO_3$.

Preferably solid oxidant 38 is a heatable latent gaseous oxidant which can be heat activated to release an oxidant gas. As shown in FIG. 3–4, module 22 can include a solid oxidant heater 42 in thermal contact with solid oxidant 38, either inside or outside of housing 26.

Preferably sealing atmosphere 40 is an inert sealing atmosphere, and more preferably is an $O_2$-free sealing atmosphere. Sealing atmosphere 40 can be an $O_2$-free oxidizing atmosphere, such as the previously described $O_2$-free oxidizing atmosphere 28.

In addition to the inclusion of solid oxidant 38, module 22 can include getter 36 sealed within housing 26, with getter 36 in contact with atmosphere 40 and contained by housing 26.

The invention further includes a module with an atmosphere with a nitrogen oxide containing atmosphere. The method of making such a semiconductor laser optical waveguide telecommunications module includes providing a semiconductor laser, providing a housing, providing an atmosphere which includes nitrogen oxide and enclosing the laser and the atmosphere within the housing. Preferably the majority of the atmosphere is an inert gas. In preferred embodiments the atmosphere contains nitrous oxide, nitric oxide, nitrogen dioxide, dinitrogen tetroxide or combinations thereof. Additionally the method may include providing a getter and enclosing the getter within the housing. Such a made module includes a semiconductor laser, a housing enclosing the laser and an atmosphere which includes nitrogen oxide with the atmosphere in contact with the laser and contained by the housing. The atmosphere preferably contains an inert gas and nitrous oxide, or nitric oxide, nitrogen dioxide, dinitrogen tetroxide, or mixtures thereof. Additionally the module can contain a getter in contact with the atmosphere. Additionally the module can contain a solid oxidant in contact with the atmosphere.

The invention further includes a module with an atmosphere with ozone and a method of making a module utilizing an ozone containing atmosphere. The method of making the semiconductor laser optical waveguide telecommunications module includes providing a semiconductor laser, providing a housing, providing an atmosphere which includes ozone and enclosing the laser and the atmosphere within the housing. Preferably the atmosphere is substantially made up of at least one inert gas (majority by volume). Additionally the method may include providing a getter and enclosing the getter within the housing. Such a made module includes a semiconductor laser, a housing, and an atmosphere containing ozone in contact with the laser and contained by the housing, and preferably further includes an inert gas in the atmosphere. Additionally a getter is in contact with the contained atmosphere. Additionally the module can contain a solid oxidant in contact with the atmosphere.

The invention further includes a module with an atmosphere with hydrogen peroxide and a method of making such. The method of making the semiconductor laser optical waveguide telecommunications module includes providing a semiconductor laser, providing a housing, providing an atmosphere which includes hydrogen peroxide and enclosing the laser and the atmosphere in the housing. preferably the atmosphere is mostly inert gas. Additionally a getter can be enclosed within the housing and in contact with the atmosphere. Such a made module includes a semiconductor laser, a housing, and an atmosphere which includes hydrogen peroxide which is in contact with the laser and contained by the housing. Preferably the atmosphere contains an inert gas or more than one inert gas. Additionally a getter is preferably in contact with the contained atmosphere. Additionally the module can contain a solid oxidant in contact with the atmosphere.

Preferably the housings are hermetically closed and the sealing of the housing includes hermetically sealing the housing closed, so as to inhibit contained gases from escaping to the surrounding outer environment and inhibit containments from the surrounding outer environment from entering the housing.

Preferably the housings are cleaned housings and the method of providing such includes cleaning the housing (plasma cleaning exposure, corona cleaning process, cleaning exposure of ozone and UV radiation, cleaning with solvents having no less than a third overtone at the $\lambda_s$ wavelength emission (for example perhalogenated solvent)).

Providing the atmosphere may include mixing and using appropriate oxidizing mixtures of the contained and enclosed gases. The atmosphere may contain a nitrogen oxide, ozone, hydrogen peroxide, first inert gas, a second inert gas and appropriate oxidizing mixtures thereof. Preferably a majority of the atmosphere is at least one inert gas. In addition to such contained and enclosed atmospheres, getters and/or solid oxidants may be utilized in contact with the contained and enclosed atmospheres.

Figure 5:
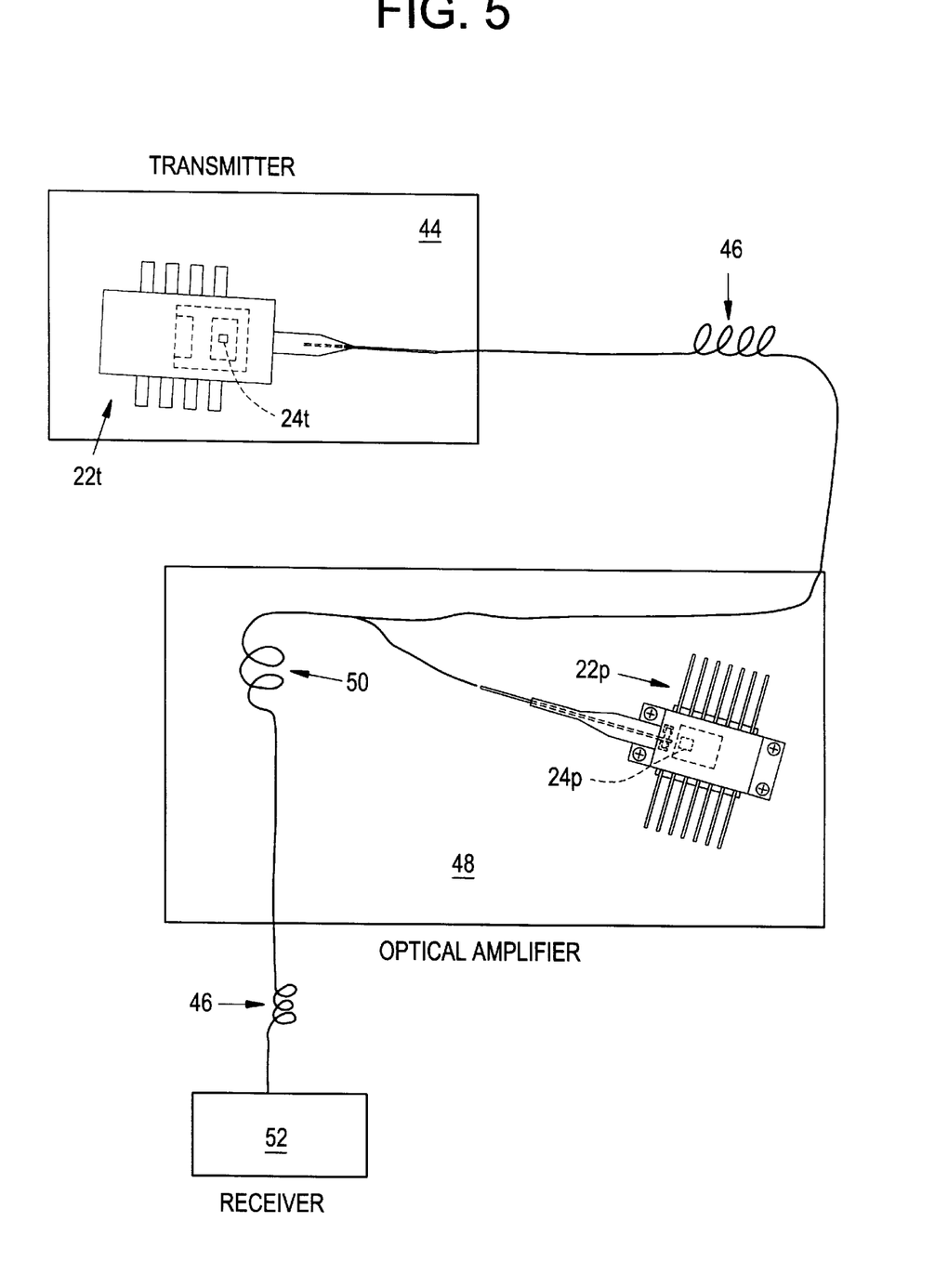
FIG. 5 is a schematic representation embodying the invention.

Semiconductor laser optical waveguide telecommunications modules 22 are used in an optical waveguide telecommunications system as shown in FIG. 5. As shown in FIG. 5, semiconductor laser optical waveguide telecommunications module 22t and semiconductor transmitter laser 24t are part of optical signal transmitter 44 which transmits optical signals through lengths of optical telecommunications fiber 46 to optical signal receiver 52. Semiconductor laser optical waveguide telecommunications module 22 is preferably utilized in an optical telecommunications system as a pump laser in an optical amplifier. As shown in FIG. 5, semiconductor laser optical waveguide telecommunications module 22p and semiconductor pump laser 24p pump/excite optically excitable optical medium 50, such as an erbium doped optical amplifier fiber. Optical amplifier 48 amplifies the optical signal transmitted through optical fibers 46. Semiconductor laser optical waveguide telecommunications module 22 is preferably a high power (preferably power greater than 100 milliwatts) optical amplifier pump laser designed to pump an optical amplifier, most preferably an erbium doped fiber amplifier which amplifies multiply signal wavelengths. Most preferably semiconductor laser 24 outputs pump light in the low pump wavelength range for erbium amplifiers that includes 980 nm. In a further embodiment semiconductor laser 24 outputs pump light in the high pump wavelength range for erbium amplifiers that includes 1480 nm.

Semiconductor laser 24 of semiconductor laser optical waveguide telecommunications module 22 is preferably made from III/V semiconductors. Preferably semiconductor laser 24 is a III/V semiconductor laser, and most preferably a III/V semiconductor strained quantum well laser. In a preferred embodiment, semiconductor laser 24 has a wavelength emission in the range from 910 nm to 990 nm. Such wavelength emissions can be achieved with GaAs/AlGaAs semiconductor lasers and GaAs/InGaAs semiconductor lasers. Strained single quantum well InGaAs/AlGaAs/GaAs semiconductor lasers have beneficial pump wavelengths outputs in the low pump wavelength range for erbium that includes 980 nm. In addition to InGaAs and AlGaAs lasers, semiconductor laser 24 can be an InGaAsP or (Al)GaInP semiconductor laser that is suited for pumping an erbium doped amplifier. In addition to producing 980 mn or 1480 nm pump light, semiconductor laser 24 can be a pump laser that emits $\lambda_s$ in the 780–880 nm range (including 808 nm for Nd pumping), 915–960 nm range (including 915–920 nm for Yb pumping, and 946 for direct L-band erbium amplifiers).

In addition to being utilized for pump lasers, the invention can be utilized with high power signal transmitter lasers. Semiconductor laser optical waveguide telecommunications module 22 can provide optical transmission signals with semiconductor laser 24 being a transmitter laser. As a transmitter laser, semiconductor laser 24 preferably emits a $\lambda$ in the 1270–1330 nm range that includes 1300 nm, or more preferably in the 1520–1620 nm that includes 1550 nm (1530–1565 nm) and/or the higher L-band wavelengths (1560–1620 nm), and are used to produce high bit rate wavelength channel signals.

In that laser module 22 is preferably an optical waveguide telecommunications module, module 22 preferably includes an optical waveguide 99 optically coupled to laser 24. Preferably optical waveguide 99 comprises an optical fiber. In a preferred embodiment an end of optical waveguide 99 is contained within housing 26. FIG. 1–2 show an end of optical waveguide fiber 99 inside housing 26. Alternatively the housing 26 may include a transparent window 100 that is transparent to the light coupled from laser 24 into optical waveguide fiber 99 end. As shown in FIG. 3–4 with such the end of waveguide 99 is not contained within container 26.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A method of making a semiconductor laser optical waveguide telecommunications module comprising:
   providing a semiconductor laser;
   providing a housing;
   providing an $O_2$-free oxidizing atmosphere; and
   enclosing said semiconductor laser and said $O_2$-free oxidizing atmosphere within said housing.

2. A method as claimed in claim 1, wherein the step of providing said laser comprises:
   providing a III/V semiconductor strained quantum well laser.

3. A method as claimed in claim 1, wherein the step of providing an $O_2$-free oxidizing atmosphere comprises:
   providing an $O_2$-free oxidizing atmosphere which has an $O_2$ molecule content less than 100 ppm by weight.

4. A method as claimed in claim 1, wherein the step of providing an $O_2$-free oxidizing atmosphere comprises:
   providing an $O_2$-free oxidizing atmosphere which includes an oxidant gas.

5. A method as claimed in claim 4, wherein the step of providing an $O_2$-free oxidizing atmosphere comprises:
   providing an $O_2$-free oxidizing atmosphere which includes an inert gas.

6. A method as claimed in claim 1, wherein the step of providing an $O_2$-free oxidizing atmosphere comprises:
   providing an $O_2$-free oxidizing atmosphere which includes a nitrogen oxide.

7. A method as claimed in claim 1, wherein the step of providing an $O_2$-free oxidizing atmosphere comprises:
   providing an $O_2$-free oxidizing atmosphere which includes nitrous oxide.

8. A method as claimed in claim 1, wherein the step of providing an $O_2$-free oxidizing atmosphere comprises:
   providing an $O_2$-free oxidizing atmosphere which includes nitric oxide.

9. A method as claimed in claim 1, wherein the step of providing an $O_2$-free oxidizing atmosphere comprises:
   providing an $O_2$-free oxidizing atmosphere which includes nitrogen dioxide.

10. A method as claimed in claim 1, wherein the step of providing an $O_2$-free oxidizing atmosphere comprises:
    providing an $O_2$-free oxidizing atmosphere which includes dinitrogen tetroxide.

11. A method as claimed in claim 1, wherein the step of providing an $O_2$-free oxidizing atmosphere comprises:
    providing an $O_2$-free oxidizing atmosphere which includes ozone.

12. A method as claimed in claim 1, wherein the step of providing an $O_2$-free oxidizing atmosphere comprises:
    providing an $O_2$-free oxidizing atmosphere which includes hydrogen peroxide.

13. A method as claimed in claim 1, further comprising the step of cleaning said housing with a plasma exposure.

14. A method as claimed in claim 1, further comprising the step of cleaning said housing using a corona process.

15. A method as claimed in claim 1, further comprising the steps of:
    cleaning said housing with an exposure of ozone and UV radiation.

16. A method as claimed in claim 1, further comprising the steps of:
    providing a solid oxidant; and
    enclosing said semiconductor laser, said atmosphere, and said solid oxidant within said housing.

17. A method as claimed in claim 1, further comprising the steps of:
    providing a getter; and
    enclosing said semiconductor laser, said atmosphere, and said getter within said housing.

18. A method as claimed in claim 1, wherein said semiconductor laser has a wavelength emission $\lambda_s$, and the method further comprises cleaning with a solvent, said solvent having no less than a third overtone at said $\lambda_s$.

19. A method as claimed in claim 18, wherein said solvent is a perhalogenated solvent.

20. A semiconductor laser module comprising:
    a semiconductor laser;
    a housing, said housing enclosing said semiconductor laser; and
    an $O_2$-free oxidizing atmosphere, said $O_2$-free oxidizing atmosphere in contact with said semiconductor laser and contained by said housing.

21. A module as claimed in claim 20, wherein said laser is a pump laser and said module is a pump module for pumping an optical amplifier.

22. A semiconductor laser module as claimed in claim 20 wherein said $O_2$-free oxidizing atmosphere has an $O_2$ molecule content of less than 100 ppm by weight.

23. A semiconductor laser module as claimed in claim 20 wherein said $O_2$-free oxidizing atmosphere includes an oxidant gas.

24. A semiconductor laser module as claimed in claim 20 wherein said $O_2$-free oxidizing atmosphere includes an inert gas.

25. A semiconductor laser module as claimed in claim 20 wherein said $O_2$-free oxidizing atmosphere includes a nitrogen oxide.

26. A semiconductor laser module as claimed in claim 20 wherein said $O_2$-free oxidizing atmosphere includes nitrous oxide.

27. A semiconductor laser module as claimed in claim 20 wherein said $O_2$-free oxidizing atmosphere includes nitric oxide.

28. A semiconductor laser module as claimed in claim 20 wherein said $O_2$-free oxidizing atmosphere includes nitrogen dioxide.

29. A semiconductor laser module as claimed in claim 20 wherein said $O_2$-free oxidizing atmosphere includes dinitrogen tetroxide.

30. A semiconductor laser module as claimed in claim 20 wherein said $O_2$-free oxidizing atmosphere includes ozone.

31. A semiconductor laser module as claimed in claim 20 wherein said $O_2$-free oxidizing atmosphere includes hydrogen peroxide.

32. A semiconductor laser module as claimed in claim 20 further comprising a getter, said getter in contact with said atmosphere and contained by said housing.

33. A method of making a semiconductor laser optical waveguide telecommunications module comprising:
    providing a semiconductor laser;
    providing a housing;
    providing a sealing atmosphere;
    providing a solid oxidant; and
    sealing said semiconductor laser, said sealing atmosphere, and said solid oxidant within said housing.

34. A method as claimed in claim 33, wherein providing a solid oxidant comprises providing a solid oxidant comprised of $KMnO_4$.

35. A method as claimed in claim 33, wherein providing a solid oxidant comprises providing a solid oxidant comprised of $Na_2O_2$.

36. A method as claimed in claim 33, wherein providing a solid oxidant comprises providing a solid oxidant comprised of $K_2S_2O_8$.

37. A method as claimed in claim 33, wherein providing a solid oxidant comprises providing a solid oxidant comprised of $KO_2$.

38. A method as claimed in claim 33, wherein providing a solid oxidant comprises providing a solid oxidant comprised of $NaBO_3$.

39. A method as claimed in claim 33, wherein providing a solid oxidant comprises providing a solid oxidant which is a latent gaseous oxidant.

40. A method as claimed in claim 39, further comprising heating said latent gaseous oxidant after sealing said semiconductor laser, said sealing atmosphere, and said solid oxidant within said housing.

41. A method as claimed in claim 33, wherein providing a sealing atmosphere comprises providing an inert sealing atmosphere.

42. A method as claimed in claim 41, wherein providing an inert sealing atmosphere comprises providing an $O_2$-free sealing atmosphere.

43. A method as claimed in claim 33, further comprising the step of cleaning said housing with a plasma exposure.

44. A method as claimed in claim 33, further comprising the step of cleaning said housing using a corona process.

45. A method as claimed in claim 33, further comprising the step of cleaning said housing with an exposure of ozone and UV radiation.

46. A method as claimed in claim 33, wherein providing a sealing atmosphere comprises providing an $O_2$-free oxidizing atmosphere.

47. A method as claimed in claim 33, further comprising the steps of providing a getter and enclosing said semiconductor laser, said atmosphere, said solid oxidant, and said getter within said housing.

48. A method as claimed in claim 33, wherein said semiconductor laser has a wavelength emission $\lambda_s$, and the method further comprises cleaning with a solvent, said solvent having no less than a third overtone at said $\lambda_s$.

49. A method as claimed in claim 34, wherein said solvent is a perhalogenated solvent.

50. A semiconductor laser module comprising:
    a semiconductor laser;
    a solid oxidant;
    a sealing atmosphere, said sealing atmosphere in contact with said semiconductor laser and said solid oxidant; and
    a housing, said housing containing said sealing atmosphere, said semiconductor laser, and said solid oxidant.

51. A semiconductor laser module as claimed in claim 50, wherein said solid oxidant is comprised of $KMnO_4$.

52. A semiconductor laser module as claimed in claim 50, wherein said solid oxidant is comprised of $Na_2O_2$.

53. A semiconductor laser module as claimed in claim 50, wherein said solid oxidant is comprised of $K_2S_2O_8$.

54. A semiconductor laser module as claimed in claim 50, wherein said solid oxidant is comprised of $KO_2$.

55. A semiconductor laser module as claimed in claim 50, wherein said solid oxidant is comprised of $NaBO_3$.

56. A semiconductor laser module as claimed in claim 50, wherein said solid oxidant is comprised of a heatable latent gaseous oxidant.

57. A semiconductor laser module as claimed in claim 50, further comprising a solid oxidant heater, said solid oxidant heater in thermal contact with said solid oxidant.

58. A semiconductor laser module as claimed in claim 50, wherein said sealing atmosphere is an inert sealing atmosphere.

59. A semiconductor laser module as claimed in claim 50, wherein said sealing atmosphere is an $O_2$-free sealing atmosphere.

60. A semiconductor laser module as claimed in claim 50, wherein said sealing atmosphere is an $O_2$-free oxidizing atmosphere.

61. A semiconductor laser module as claimed in claim 50 further comprising a getter, said getter in contact with said atmosphere and contained by said housing.

62. A method of making a semiconductor laser optical waveguide telecommunications module comprising:
    providing a semiconductor laser;
    providing a housing;
    providing an oxidizing atmosphere which includes a nitrogen oxide; and
    enclosing said semiconductor laser and said atmosphere within said housing.

63. A method as claimed in claim 62, wherein providing an atmosphere comprises providing an atmosphere which includes an inert gas.

64. A method as claimed in claim 62, wherein providing an atmosphere which includes nitrogen oxide comprises providing an atmosphere which includes nitrous oxide.

65. A method as claimed in claim 62, wherein providing an atmosphere which includes nitrogen oxide comprises providing an atmosphere which includes nitric oxide.

66. A method as claimed in claim 62, wherein providing an atmosphere which includes nitrogen oxide comprises providing an atmosphere which includes nitrogen dioxide.

67. A method as claimed in claim 62, wherein providing an atmosphere which includes nitrogen oxide comprises providing an atmosphere which includes dinitrogen tetroxide.

68. A method as claimed in 62, further comprising the steps of:

providing a getter; and enclosing said semiconductor laser, said atmosphere, and said getter within said housing.

69. A semiconductor laser module comprising:

a semiconductor laser;

a housing, said housing enclosing said semiconductor laser; and an atmosphere which includes a nitrogen oxide, said atmosphere in contact with said semiconductor laser and contained by said housing.

70. A semiconductor laser module as claimed in claim 69 wherein said atmosphere includes an inert gas.

71. A semiconductor laser module as claimed in claim 69 wherein said atmosphere includes nitrous oxide.

72. A semiconductor laser module as claimed in claim 69 wherein said atmosphere includes nitric oxide.

73. A semiconductor laser module as claimed in claim 69 wherein said atmosphere includes nitrogen dioxide.

74. A semiconductor laser module as claimed in claim 69 wherein said atmosphere includes dinitrogen tetroxide.

75. A semiconductor laser module as claimed in claim 69 further comprising a getter, said getter in contact with said atmosphere and contained by said housing.

76. A method of making a semiconductor laser optical waveguide telecommunications module comprising:

providing a semiconductor laser;

providing a housing;

providing an atmosphere which includes ozone; and enclosing said semiconductor laser and said atmosphere within said housing.

77. A method as claimed in claim 76, wherein providing an atmosphere comprises providing an atmosphere which includes an inert gas.

78. A method as claimed in claim 76, further comprising the steps of:

providing a getter; and enclosing said semiconductor laser, said atmosphere, and said getter within said housing.

79. A semiconductor laser module comprising:

a semiconductor laser;

a housing, said housing enclosing said semiconductor laser; and an atmosphere which includes ozone, said atmosphere in contact with said semiconductor laser and contained by said housing.

80. A semiconductor laser module as claimed in claim 79 wherein said atmosphere includes an inert gas.

81. A semiconductor laser module as claimed in claim 79 further comprising a getter, said getter in contact with said atmosphere and contained by said housing.

82. A method of making a semiconductor laser optical waveguide telecommunications module comprising:

providing a semiconductor laser;

providing a housing;

providing an atmosphere which includes hydrogen peroxide; and enclosing said semiconductor laser and said atmosphere within said housing.

83. A method as claimed in claim 82, further comprising the steps of:

providing a getter; and enclosing said semiconductor laser, said atmosphere, and said getter within said housing.

84. A method as claimed in claim 82, wherein said atmosphere includes an inert gas.

85. A semiconductor laser module comprising:

a semiconductor laser;

a housing, said housing enclosing said semiconductor laser; and an atmosphere which includes hydrogen peroxide, said atmosphere in contact with said semiconductor laser and contained by said housing.

86. A semicondutor laser module as claimed in claim 85 wherein said atmosphere includes an inert gas.

87. A semiconductor laser module as claimed in claim 85 further comprising a getter, said getter in contact with said atmosphere and contained by said housing.

* * * * *